US 11,486,925 B2

United States Patent
He et al.

(10) Patent No.: US 11,486,925 B2
(45) Date of Patent: Nov. 1, 2022

(54) METHOD FOR DIAGNOSING ANALOG CIRCUIT FAULT BASED ON VECTOR-VALUED REGULARIZED KERNEL FUNCTION APPROXIMATION

(71) Applicant: HEFEI UNIVERSITY OF TECHNOLOGY, Anhui (CN)

(72) Inventors: Yigang He, Anhui (CN); Wei He, Anhui (CN); Baiqiang Yin, Anhui (CN); Bing Li, Anhui (CN); Zhigang Li, Anhui (CN); Lei Zuo, Anhui (CN); Chaolong Zhang, Anhui (CN)

(73) Assignee: HEFEI UNIVERSITY OF TECHNOLOGY, Anhui (CN)

( * ) Notice: Subject to any disclaimer, the term of this patent is extended or adjusted under 35 U.S.C. 154(b) by 92 days.

(21) Appl. No.: 16/870,940

(22) Filed: May 9, 2020

(65) Prior Publication Data
US 2020/0271720 A1   Aug. 27, 2020

(51) Int. Cl.
| | |
|---|---|
| *G01R 31/3163* | (2006.01) |
| *G06N 5/04* | (2006.01) |
| *G06N 20/00* | (2019.01) |
| *G06N 3/00* | (2006.01) |

(52) U.S. Cl.
CPC ......... *G01R 31/3163* (2013.01); *G06N 3/006* (2013.01); *G06N 5/04* (2013.01); *G06N 20/00* (2019.01)

(58) Field of Classification Search
CPC .... G01R 31/3163; G06N 20/00; G06N 3/006; G06N 5/04
See application file for complete search history.

(56) References Cited

U.S. PATENT DOCUMENTS

| | | | | |
|---|---|---|---|---|
| 2010/0023307 A1* | 1/2010 | Lee | ...................... | G06K 9/6226 703/7 |
| 2011/0307438 A1* | 12/2011 | Fernández Martínez | ................... | G06N 7/005 706/52 |
| 2018/0038909 A1* | 2/2018 | He | ........................ | G01R 31/316 |
| 2018/0039865 A1* | 2/2018 | Yuan | ..................... | G01R 31/316 |
| 2019/0383700 A1* | 12/2019 | Matei | ..................... | G01M 13/00 |

FOREIGN PATENT DOCUMENTS

CN         105548862 A  *  5/2016  ........... G01R 31/316

\* cited by examiner

*Primary Examiner* — Raymond L Nimox

(57) ABSTRACT

A method for diagnosing analog circuit fault based on vector-valued regularized kernel function approximation, includes steps of: step (1) acquiring a fault response voltage signal of an analog circuit; step (2) carrying out wavelet packet transform on the collected signal, and calculating a wavelet packet coefficient energy value as a characteristic parameter; step (3) utilizing a quantum particle swarm optimization algorithm to optimize a regularization parameter and kernel parameter of vector-valued regularized kernel function approximation, and training a fault diagnosis model; and step (4) utilizing the trained diagnosis model to recognize circuit faults.

3 Claims, 2 Drawing Sheets

METHOD FOR DIAGNOSING ANALOG CIRCUIT FAULT BASED ON VECTOR-VALUED REGULARIZED KERNEL FUNCTION APPROXIMATION

BACKGROUND OF THE PRESENT INVENTION

Field of Invention

The present invention belongs to the technical field of fault diagnosis of analog circuits, and particularly relates to a method for diagnosing analog circuit fault based on vector-valued regularized kernel function approximation.

Description of Related Arts

With the development of integrated circuit technology, large-scale digital-analog hybrid integrated circuits have been widely applied to the fields of consumer electronics, industrial control and aerospace. Once the large-scale digital-analog hybrid integrated circuits break down, the performance and function of equipment will be affected, and even catastrophic consequences will be caused. According to data reports, the fault diagnosis and test cost of the analog part which only accounts for 5% of an integrated circuit chip reaches as high as 95% of the total cost, which means that it is necessary to carry out a study on the fault diagnosis and test technique of analog circuits.

Nowadays, Artificial Neural Network (ANN) and Support Vector Machine (SVM) have been used by many researchers to diagnose the faults of analog circuits. However, ANN has a low learning speed and tends to be trapped by local optimizations and over-training, thus hardly satisfying the requirement for real-time diagnosis. SVM based on structural risk minimization can solve the problems of small samples and non-linearity of classification, but it cannot fulfill the optimum classification ability in the presence of imbalanced data sets and big samples.

SUMMARY OF THE PRESENT INVENTION

The technical issue to be settled by the present invention is to overcome the aforementioned defects of the conventional arts by providing a method for diagnosing analog circuit fault based on vector-valued regularized kernel function approximation, which has a high diagnosis speed and accuracy.

According to the present invention, time domain response signals of a circuit under test are collected first; after wavelet packet decomposition is carried out on the time domain response signals, energy values of all nodes are calculated to serve as sample characteristic parameters; a regularization parameter and kernel parameter of a VVRKFA model are optimized by means of QPSO, and a VVRKFA-based fault diagnosis model is constructed; and finally, test data is input to the fault diagnosis model to recognize fault classes.

In the present invention, VVRKFA is introduced to fault diagnosis of analog circuits for the first time. In the present invention, VVRKFA is adopted to construct a fault diagnosis classifier to locate faults. When VVRKFA is adopted to distinguish different fault classes, the regularization parameter and kernel parameter of VVRKFA need to be selected to fulfill the optimum classification performance. By using VVRKFA to recognize faults, the present invention has higher fault diagnosis accuracy than other existing methods; and when massive data is processed, VVRKFA takes a shorter training and testing time.

In order to solve the technical problems mentioned above, technical solutions adopted by the present invention are as follows.

A method for diagnosing analog circuit fault based on vector-valued regularized kernel function approximation (VVRKFA) comprises following steps of:

A method for diagnosing an analog circuit fault based on vector-valued regularized kernel function approximation, comprising steps of:

step (1): collecting output signals comprising: extracting time domain response voltage signals of all nodes of an analog circuit under test;

step (2): carrying out wavelet packet decomposition on the output signals collected, calculating energy of all nodes as original sample characteristic data, and equally dividing the original sample characteristic data into a training sample set and a test sample set;

step (3): utilizing a Quantum particle swarm optimization (QPSO) algorithm to optimize a regularization parameter and kernel parameter of vector-valued regularized kernel function approximation (VVRKFA) on the basis of the training sample set, and constructing a VVRKFA-based fault diagnosis model;

step (4): inputting the test sample set to the constructed VVRKFA-based fault diagnosis model to recognize circuit fault classes.

Furthermore, in step (1), the analog circuit under test only has an input terminal and an output terminal, a sinusoidal signal is input to the input terminal, and voltage signals are sampled at the output terminal.

Furthermore, in step (2), db10 wavelet packet transform is carried out on the collected output signals (namely the voltage signals).

In step (3), the process of constructing the VVRKFA-based fault diagnosis model comprises steps of:

(3.a) determining a type of a kernel function:

selecting a Gaussian kernel function $K(x_i, x_j) = \exp(\sigma \|x_i - x_j\|^2)$ as the kernel function of VVRKFA to establish a mathematic model of VVRKFA, wherein $\sigma$ is a width factor of the Gaussian kernel function;

wherein a mathematic model of VVRKFA is:

$$\text{Min } J(\Theta, b, \xi) = \frac{C}{2} tr([\Theta \ b]^T [\Theta \ b]) + \frac{1}{2} \sum_{i=1}^{m} \|\xi_i\|^2 \quad (1)$$

$$\text{s.t. } \Theta K(x_i^T, B^T)^T + b + \xi_i = Y_i, i = 1, 2, \ldots, m$$

wherein, $\Theta \in \Re^{N \times \overline{m}}$ is a regression coefficient matrix for mapping a characteristic inner product space to a label space; N is an amount of fault classes; m is a dimensionality of training samples in the training sample set; $\overline{m}$ is a dimensionality of samples in a dimensionality-reduced sample data set obtained after the dimensionality of the training sample set is reduced; $b \in \Re^{N \times 1}$ is a base vector; C is the regularization parameter; $\xi_i \in \Re^{N \times 1}$ is a slack variable; matrix $B \in \Re^{\overline{m} \times n}$ is the dimensionality-reduced sample data set ($\overline{m} \leq m$) obtained after the dimensionality of the training sample set is reduced; n is an amount of all the training samples in the training sample set; K(.,.) is the kernel function; $x_i$ is the training samples in the training sample set; $Y_i$ is a category label vector of the training sample $x_i$; T is a matrix transpose symbol; J is a target function name; $[\Theta \ b] = YP^T[CI+PP^T]^{-1}$, wherein $P = [k(A, B^T)e]^T \in \Re^{(\overline{m}+1) \times m}$, $A \in$ $\Re^{m \times n}$ is the training sample set; I is a unit matrix, and $Y \in \Re^{N \times m}$ is a matrix comprising m category label vectors of the training samples;

(3.b) by utilizing the quantum particle swarm optimization algorithm to optimize the mathematic model of VVRKFA, obtaining an optimum regularization parameter and an optimum kernel parameter of the mathematic model of VVRKFA;

(3.c) taking the training samples xi in the training sample set as input data, constructing a vector value mapping function (2) for the optimum regularization parameter and the optimum kernel parameter obtained in step (3.b);

$$p(x_i) = \Theta K(x_i^T, B^T)^T + b \quad (2)$$

wherein, $\Theta \in \Re^{N \times \overline{m}}$ is the regression coefficient matrix; $B \in \Re^{\overline{m} \times n}$ is the dimensionality-reduced sample data set obtained after the dimensionality of the training sample set is reduced; K(.,.) is the kernel function, and in formula (2), the kernel function refers to the optimum kernel function obtained in step (3.b); C is the regularization parameter, and in formula (2), the regularization parameter C is the optimum kernel parameter obtained in step (3.b); $b \in \Re_{N \times 1}$ is the base vector, N is the number of fault classes; m is the dimensionality of training samples in the training sample set; $\overline{m}$ is the dimensionality of the samples in the dimensionality-reduced sample data set obtained after the dimensionality of the training sample set is reduced; n is the amount of all the training samples in the training sample set;

(3.d) by utilizing the mapping function constructed in step (3.c), establishing a decision function of VVRKFA, wherein the decision function of VVRKFA is expressed as:

$$\text{Class}(x_t) = \arg\min_{1 \leq j \leq N} d_M(\hat{p}(x_t), \overline{p}^{(j)} | \hat{\Sigma}) \quad (3)$$

wherein, $x_t$ is test samples in the test sample set; $\overline{p}^{(j)} = (1/n_j) \Sigma_{i=1}^{n_j} \hat{p}(x_i)$ is the center point of all training samples corresponding to the $j^{th}$ fault class in the training sample set, $d_M$ is the Mahalanobis distance, $x_i$ is the training samples in the training sample set, $\hat{\Sigma} = \Sigma_{j=1}^{N}(n_j-1)\hat{\Sigma}^{(j)}/(n-N)$ is an intra-class covariance matrix, and n is the amount of all the training samples in the training sample set; N is the number of fault classes; $n_j$ is the amount of training samples corresponding to the $j^{th}$ fault class in the training sample set; $\hat{p}(x_i)$ is a mapping projection of the training samples $x_i$ in a characteristic sub-space; $\hat{p}(x_t)$ is a mapping projection of the test samples $x_t$ in the characteristic sub-space.

wherein when the decision function is established, constructing the VVRKFA-based fault diagnosis model is accomplished.

Furthermore, in step (3.b): utilizing the quantum particle swarm optimization algorithm to optimize the regularization parameter and kernel parameter of the mathematic model of VVRKFA to obtain an optimum regularization parameter and an optimum kernel parameter of the mathematic model of VVRKFA specifically comprises steps of:

(3.b.1) initializing parameters of the QPSO algorithm, comprising velocity, location, population size, iterations and optimization range, wherein each particle is a two-dimensional vector, a first dimension is the regularization parameter of the mathematic model of VVRKFA, and a second dimension is the kernel parameter of the mathematic model of VVRKFA;

(3.b.2) calculating a fitness of the particles to obtain a global optimum individual and a local optimum individual;

(3.b.3) updating a velocity and location of the particles; and (3.b.4) repeating step (3.b.2) and Step (3.b.3) until a maximum iteration is reached, and outputting an optimum parameter result, which is denoted as the optimum regularization parameter and the optimum kernel parameter of the mathematic model of VVRKFA.

Furthermore, in step (4), inputting the test sample data set to the fault diagnosis model to recognize the circuit fault classes to obtain the fault class of each test sample in the test sample set, thereby the diagnosis accuracy of each fault class is obtained, and diagnosis of the analog circuit under test is completed.

The analog circuit fault diagnosis method of the present invention adopts vector-valued regularized kernel function approximation (VVRKFA), so that the time and space can be greatly saved on the premise that high diagnosis accuracy is maintained; and the analog circuit fault diagnosis method is obviously superior to traditional fault classification methods.

Compared with conventional arts, the present invention has beneficial effects as follows.

(1) VVRKFA is introduced into fault diagnosis of analog circuits for the first time; and compared with traditional methods based on ANN and SVM, VVRKFA has higher classification precision, takes a shorter time and occupies a smaller space. (2) The QPSO algorithm is adopted to optimize the regularization parameter and kernel parameter of VVRKFA; and compared with the traditional grid searching method, the QPSO algorithm can obtain the optimum parameters, thus remarkably improving the performance of QPSO algorithm.

DETAILED DESCRIPTION OF THE PREFERRED EMBODIMENT

The present invention is further expounded below in conjunction with the accompanying drawings and embodiments.

Figure 1:
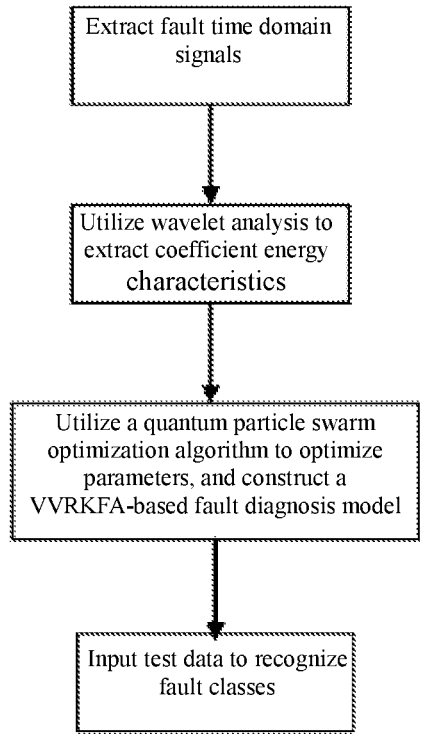
FIG. 1 is a flow diagram of method for diagnosing analog circuit fault based on vector-valued regularized kernel function approximation of the present invention.

Referring to FIG. 1, an analog circuit fault diagnosis method based on Vector-Valued regularized kernel function approximation of the present invention comprises following four steps: (1) extracting time domain response signals of an analog circuit under test; (2) carrying out three-layer db10 wavelet packet decomposition on the signals to extract three layers of nodes, adopting energy of eight nodes as original sample characteristic data, and equally dividing the original sample characteristic data into a training sample set and a test sample data; (3) on the basis of the training sample set, optimizing parameters of a mathematic model of VVRKFA by means of a QPSO algorithm; and (4) inputting the test sample set to a constructed VVRKFA-based fault diagnosis model to recognize circuit fault classes.

In step (1), the time domain response signals of the analog circuit under test are acquired, an input terminal is excited by a sinusoidal signal with a voltage of 5V and a frequency of 100 Hz, and voltage signals are sampled at an output terminal.

In step (2), the energy of the nodes is calculated as follows.

During wavelet packet analysis, the signals are projected to a space spanned by a set of mutually orthogonal wavelet basis functions and are decomposed into a high-frequency part and a low-frequency part, and the low-frequency part and the high-frequency part are decomposed in the next layer of decomposition, so that finer analysis is realized.

The function of wavelet packet $\mu_{j,k}(t)$ is defined as:

$$\mu_{j,k}(t)=2^{j/2}\mu(2^j t-k);$$

Wherein, $j \in Z$ is the number of decomposition layers, $k \in Z$ is the number of frequency band data points, and t is the time point;

A wavelet packet decomposition algorithm for a set of discrete signals $x(t)$ is as follows:

$$d_{j+1}^{2n} = \sum_k h(k-2t)d_j^n(k)$$

$$d_{j+1}^{2n+1} = \sum_k g(k-2t)d_j^n(k);$$

wherein, $h(k-2t)$ and $g(k-2t)$ are respectively the coefficients of a low pass filter and a high pass filter in corresponding multi-scale analysis; $d_j^n(k)$ is the $k^{th}$ wavelet decomposition coefficient point in the $n^{th}$ frequency band in the $j^{th}$ layer; $d_{j+1}^{2n}$ is a wavelet decomposition sequence of the $2n^{th}$ frequency band of the $(j+1)^{th}$ layer; $d_{j+1}^{2n+1}$ is a wavelet decomposition sequence of the $(2n+1)^{th}$ frequency band of the (j+1)th layer; $k \in Z$ is the number of frequency band data points; t is the time point.

$$d_j^n(k) = 2\left[\sum_t h(k-2\tau)d_{j+1}^{2n+1}(k) + \sum_t g(k-2\tau)d_{j+1}^{2n}(k)\right]$$

represents the $k^{th}$ coefficient corresponding to the node (j,n) after wavelet packet decomposition, the node (j,n) represents the nth frequency band of the $j^{th}$ layer, and $\tau$ is a translation parameter.

The energy values of wavelet packet nodes are calculated as follows:

$$E_i = \sum_{k=1}^{N}|d_j^n(k)|^2; i = 1, 2, \ldots, 2^j;$$

wherein, N is the length of the $i^{th}$ frequency band, j is the number of layers of wavelet decomposition, k is the sequence points of the frequency bands, and $d_j^n(k)$ is the $k^{th}$ wavelet decomposition coefficient of the $i^{th}$ frequency band of the $j^{th}$ layer.

The VVRKFA-based fault diagnosis model is established through the following steps:

(3.a) The type of a kernel function is determined:

A Gaussian kernel function $K(x_i,x_j)=\exp(\sigma\|x_i-x_j\|^2)$ is adopted as the kernel function of VVRKFA to establish a mathematic model of VVRKFA, wherein is a width factor of the Gaussian kernel function;

The mathematic model of VVRKFA is as follows:

$$\text{Min } J(\Theta, b, \xi) = \frac{C}{2}tr([\Theta \ b]^T[\Theta \ b]) + \frac{1}{2}\sum_{i=1}^{m}\|\xi_i\|^2 \quad (1)$$

$$\text{s.t. } \Theta K(x_i^T, B^T)^T + b + \xi_i = Y_i, i = 1, 2, \ldots, m$$

wherein, $\Theta \in \Re^{N \times \bar{m}}$ is a regression coefficient matrix for mapping a characteristic inner product space to a label space; N is the number of fault classes; m is the dimensionality of training samples in the training sample set; $\bar{m}$ is the dimensionality of samples in a dimensionality-reduced sample data set obtained after the dimensionality of the training sample set is reduced; $b \in \Re^{N \times 1}$ is a s a base vector; C is a regularization parameter; $\xi_i \in \Re^{N \times 1}$ is a slack variable; the value of elements $x_j$ in the kernel function of VVRKFA is matrix B, matrix $B \in \Re^{\bar{m} \times n}$ is the dimensionality-reduced sample data set ($\bar{m} \leq m$) obtained after the dimensionality of the training sample set is reduced; n is the number of all the training samples in the training sample set; K(.,.) is the kernel function; $x_i$ is the training samples in the training sample set; $Y_i$ is a category label vector of the training sample $x_i$; T is a matrix transpose symbol; J is a target function name; $[\Theta \ b]=YP^T[CI+PP^T]^{-1}$, wherein $P=[k(A, B^T)e]^T \in \Re^{(\bar{m}+1) \times m}$; $A \in \Re^{m \times n}$ is the training sample set; I is a unit matrix, and $Y \in \Re^{N \times m}$ is a matrix including m category label vectors of the training samples;

(3.b) the quantum particle swarm optimization algorithm is utilized to optimize the mathematic model of VVRKFA to obtain an optimum regularization parameter and an optimum kernel parameter of the mathematic model of VVRKFA;

(3.c) with the training samples $x_i$ in the training sample set as input data, the following vector value mapping function is constructed for the optimum regularization parameter and the optimum kernel parameter obtained in Step (3.b);

$$p(x_i)=\Theta K(x_i^T,B^T)^T+b \quad (2)$$

wherein, $\Theta \in \Re^{N \times \bar{m}}$ is the regression coefficient matrix, $B \in \Re^{\bar{m} \times n}$ is the dimensionality-reduced sample data set obtained after the dimensionality of the training sample set is reduced; K(.,.) is the kernel function, and in formula (2), the kernel function particularly refers to the optimum kernel function obtained in Step (3.b); C is a regularization parameter, and in formula (2), the regularization parameter C is the optimum kernel parameter obtained in Step (3.b); $b \in \Re^{N \times 1}$ is the base vector, N is the number of fault classes; m is the dimensionality of training samples in the training sample set; $\bar{m}$ is the dimensionality of the samples in a dimensionality-reduced sample data set obtained after the dimensionality of the training sample set is reduced; n is the number of all the training samples in the training sample set;

(3.d) the mapping function constructed in Step (3.c) is utilized to establish a decision function of VVRKFA, wherein the decision function of VVRKFA is expressed as follows:

$$\text{Class}(x)=\arg \min_{1 \leq j \leq N} d_M(\hat{p}(x_t),\bar{p}^{(j)}|\hat{\Sigma}); \quad (3)$$

wherein, $x_t$ is test samples in the test sample set; $\bar{p}_{(j)}=(1/n_j)\Sigma_{i=1}^{n_j}\hat{p}(x_i)$ is the center point of all training samples corresponding to the $j^{th}$ fault class in the training sample set, $d_M$ is the Mahalanobis distance, $x_i$ is the training samples in the training sample set, $\hat{\Sigma}=1 \ (n_j-1)\hat{\Sigma}^{(j)}/(n-N)$ is an intra-class covariance matrix, and n is the number of all the training samples in the training sample set; $n_j$ is the number of training samples corresponding to the $j^{th}$ fault class in the training sample set; $\hat{p}(x_i)$ is a mapping projection of the training sample $x_i$ in a characteristic sub-space; $\hat{p}(x_i)$ is a mapping projection of the test sample $x_i$ in the characteristic sub-space.

When the decision function is established, constructing the VVRKFA-based fault diagnosis model is accomplished.

The process of utilizing the quantum particle swarm optimization algorithm to optimize the regularization parameter and kernel parameter of the mathematic model of VVRKFA to obtain an optimum regularization parameter and an optimum kernel parameter of the mathematic model of VVRKFA particularly comprises following steps of:

(3.b.1) initializing parameters of the QPSO algorithm, comprising velocity, location, population size, iterations and optimization range, wherein each particle is a two-dimensional vector, a first dimension is the regularization parameter of the mathematic model of VVRKFA, and a second dimension is the kernel parameter of the mathematic model of VVRKFA;

(3.b.2) calculating the fitness of the particles to obtain a global optimum individual and a local optimum individual;

(3.b.3) updating the velocity and location of the particles according to the following update expression:

(3.b.4) repeating step (3.b.2) and step (3.b.3) are until the maximum iterations is reached, and a result is output.

The particle location update formula in QPSO algorithm is:

$$X_i(t+1)=P'_i(t)\pm\alpha|Mbest_i(t+1)-X_i(t)|\times In(1/u);$$

In the formula $$Mbest_i(t) = \frac{1}{N}\sum_{j=1}^{N}P_j(t-1),$$

$$P'_i(t) = P_i(t-1) + (1-\beta)P_g(t-1),$$

$$\alpha = \omega_{max} - \frac{iter}{iter_{max}} \times \omega_{min},$$

wherein, N is the population size, and Mbest is the mean point of individual optimum locations of all the particles; $\omega_{max}$ is the maximum inertia weight; $\omega_{min}$ is the minimum inertia weight, and $P_j$ and $P_g$ are respectively the individual optimum location and the global optimum location of particle j; X is the particle location; t is the current iteration; $\alpha$ is a compression and expansion factor; u and $\beta$ are random numbers regularly distributed within [0,1]; $P'_i$ is an updated location of particle i; $P_i$ is the current location of particle i.

In step (4), the test sample data set is input to the fault diagnosis model to recognize the circuit fault classes to obtain the fault class of each test sample in the test sample set, then the diagnosis accuracy of each fault class is obtained, and diagnosis of the analog circuit under test is completed.

The implementation process and performance of the analog circuit fault diagnosis method based on VVRKFA of the present invention are explained below with reference to an embodiment.

Figure 2:
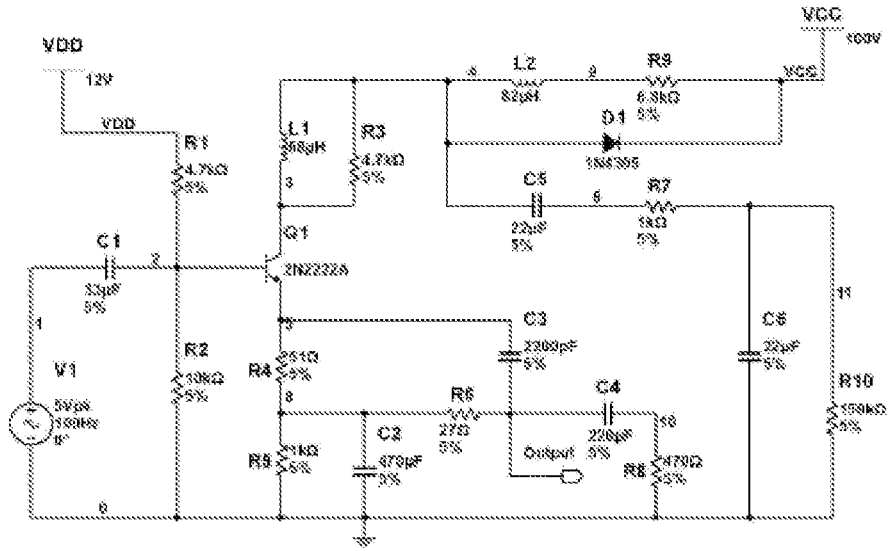
FIG. 2 is a circuit diagram of a video amplifier circuit adopted in the present invention.

Nominal values and tolerances of all elements of a video amplifier circuit shown in FIG. 2 are marked out in the figure. The whole process of the fault diagnosis method of the present invention is illustrated with this circuit as an example, wherein a sinusoidal signal with a voltage of 5V and a frequency of 100 Hz is used as an excitation source, and time domain fault response signals are sampled at the output terminal of the circuit. R1, R2, R3, R4, R5, R6, R8 and Q1 are selected as test objects. Table 1 and Table 2 show the fault codes, nominal values and fault values of the test elements, wherein T represents that the fault value is greater than the nominal value, and J represents that the fault value is lower than the nominal value. No fault is also regarded as a fault with the fault code F0. 60 data is sampled for each fault class and is divided into two parts, wherein the front 30 data is used to construct the VVRKFA-based fault diagnosis model, and the last 30 data is used to test the performance of the VVRKFA-based fault diagnosis model.

TABLE 1

Parameter faults of the video amplifier circuit

| Fault code | Fault class | Fault value | Fault code | Fault class | Fault value |
|---|---|---|---|---|---|
| F1 | R2↑ | 15 kΩ | F2 | R2↓ | 6 kΩ |
| F3 | R4↑ | 100Ω | F4 | R4↓ | 27Ω |
| F5 | R6↑ | 150Ω | F6 | R6↓ | 5Ω |
| F7 | R8↑ | 1 kΩ | F8 | R8↓ | 50Ω |

TABLE 2

Catastrophic faults of the video amplifier circuit

| Fault code | Fault value | Fault code | Fault value |
|---|---|---|---|
| F9 | R1 open circuit | F10 | R1 short circuit |
| F11 | R3 short circuit | F12 | C4 open circuit |
| F13 | R5 open circuit | F14 | base open circuit |
| F15 | base-emitter short circuit | F16 | collector open circuit |

Figure 3:
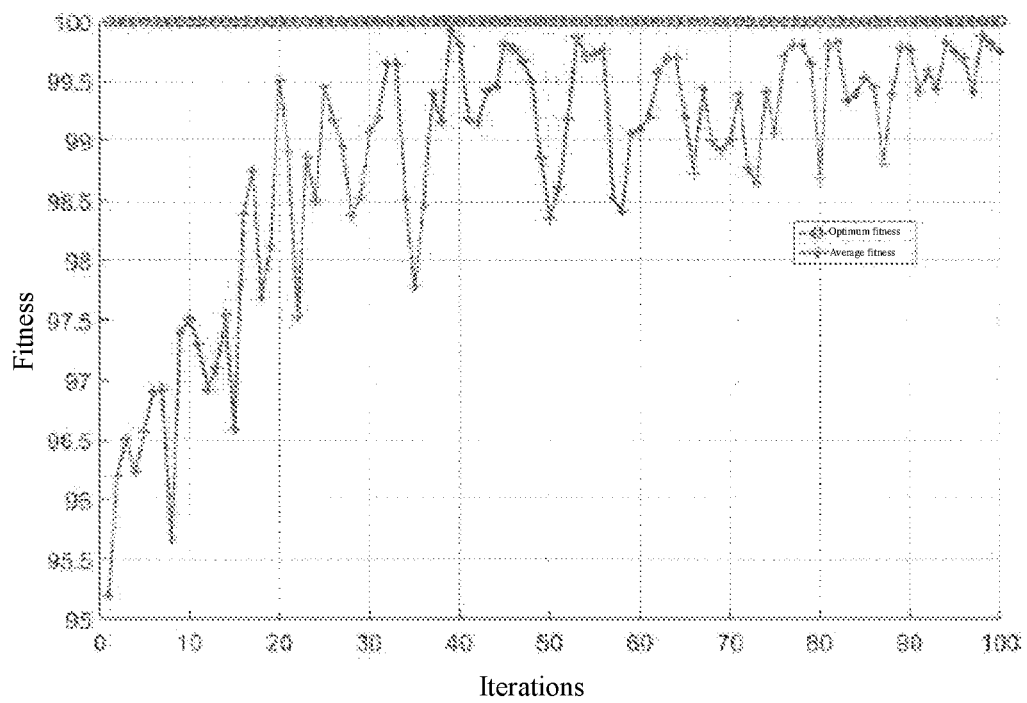
FIG. 3 is shows a training process for optimizing parameters of vector-valued regularized kernel function approximation by means of a quantum particle swarm optimization algorithm.

In the QPSO algorithm, the population size and the iterations are respectively weight is set to 0.5. During simulation, the regularization parameter and kernel width factor obtained by optimization are respectively $1.0076*10^{-4}$ and 1.0095. The training process of the QPSO-optimized VVRKFA is shown in FIG. 3. The optimum regularization parameter and the optimum kernel width factor obtained by optimization are used to construct the VVRKFA-based fault diagnosis model, and test data is input to the fault diagnosis model to recognize faults. The diagnosis results are shown in Table 3. The GMKL-SVM fault diagnosis model with the parameters selected by QPSO correctly recognized all faults F0, F1, F3, F4, F7, F8, F11, F11, F12, F13, F14, F15 and F14, recognized two faults F2 into faults F5 by mistake, recognized one fault F5 into fault F3 by mistake, and recognized one fault F6 into fault F0 by mistake. It can be considered that the VVRKFA-based fault diagnosis model with the regularization parameter and kernel width factor optimized by the QPSO algorithm has a good fault diagnosis effect. Through calculation, the overall fault diagnosis accuracy of the analog circuit can reach 98.82%.

TABLE 3

Diagnosis results of fault classes

| | F0 | F1 | F2 | F3 | F4 | F5 | F6 | F7 | F8 | F9 | F10 | F11 | F12 | F13 | F14 | F15 | F16 |
|---|---|---|---|---|---|---|---|---|---|---|---|---|---|---|---|---|---|
| F0 | 30 | | | | | | | | | | | | | | | | |
| F1 | | 30 | | | | | | | | | | | | | | | |

TABLE 3-continued

Diagnosis results of fault classes

| | F0 | F1 | F2 | F3 | F4 | F5 | F6 | F7 | F8 | F9 | F10 | F11 | F12 | F13 | F14 | F15 | F16 |
|---|---|---|---|---|---|---|---|---|---|---|---|---|---|---|---|---|---|
| F2 | | | 28 | | | 2 | | | | | | | | | | | |
| F3 | | | | 30 | | | | | | | | | | | | | |
| F4 | | | | | 30 | | | | | | | | | | | | |
| F5 | | | | 1 | | 29 | | | | | | | | | | | |
| F6 | 1 | | | | | | 29 | | | | | | | | | | |
| F7 | | | | | | | | 30 | | | | | | | | | |
| F8 | | | | | | | | | 30 | | | | | | | | |
| F9 | | | | | | | | | | 30 | | | | | | | |
| F10 | | | | | | | | | | | 30 | | | | | | |
| F11 | | | | | | | | | | | | 30 | | | | | |
| F12 | | | | | | | | | | | | | 30 | | | | |
| F13 | | | | | | | | | | | | | | 30 | | | |
| F14 | | | | | | | | | | | | | | | 30 | | |
| F15 | | | | | | | | | | | | | | | | 30 | |
| F16 | | | | | | | | | | | | | | | | | 30 |

What is claimed is:

1. A method for diagnosing an analog circuit fault based on vector-valued regularized kernel function approximation, comprising steps of:

step (1): collecting output signals comprising: extracting time domain response voltage signals of all nodes of an analog circuit under test;

step (2): carrying out wavelet packet decomposition on the output signals collected, calculating energy of all nodes as original sample characteristic data, and equally dividing the original sample characteristic data into a training sample set and a test sample set;

step (3): utilizing a quantum particle swarm optimization (QPSO) algorithm to optimize a regularization parameter and kernel parameter of vector-valued regularized kernel function approximation (VVRKFA) on the basis of the training sample set, and constructing a VVRKFA-based fault diagnosis model;

step (4): inputting the test sample set to the constructed VVRKFA-based fault diagnosis model to recognize circuit fault classes;

wherein in step (3), the process of constructing the VVRKFA-based fault diagnosis model comprises steps of:

(3.a) determining a type of a kernel function:

adopting a Gaussian kernel function $K(x_i, x_j) = \exp(\sigma \|x_i - x_j\|)$ is as the kernel function of VVRKFA to establish a mathematic model of VVRKFA, wherein $\sigma$ is a width factor of the Gaussian kernel function;

wherein a mathematic model of VVRKFA is:

$$\text{Min } J(\Theta, b, \xi) = \frac{C}{2} tr([\Theta \ b]^T [\Theta \ b]) + \frac{1}{2} \sum_{i=1}^{m} \|\xi_i\|^2; \quad (1)$$

$$\text{s.t. } \Theta K(x_i^T, B^T)^T + b + \xi_i = Y_i, i = 1, 2, \ldots, m$$

wherein, $\Theta \in \mathbb{R}^{N \times \overline{m}}$ is a regression coefficient matrix for mapping a characteristic inner product space to a label space; N is an amount of fault classes; m is a dimensionality of training samples in the training sample set; $\overline{m}$ is a dimensionality of samples in a dimensionality-reduced sample data set obtained after the dimensionality of the training sample set is reduced; $b \in \mathfrak{R}^{N \times 1}$ is a base vector; C is the regularization parameter; $\xi_i \in \mathfrak{R}^{N \times 1}$ is a slack variable; matrix $B \in \mathfrak{R}^{\overline{m} \times n}$ is the dimensionality-reduced sample data set ($\overline{m} \leq m$) obtained after the dimensionality of the training sample set is reduced; n is an amount of all the training samples in the training sample set; $K(.,.)$ is the kernel function; $x_i$ is the training samples in the training sample set; $Y_i$ is a category label vector of the training sample $x_i$; T is a matrix transpose symbol; J is a target function name; $[\Theta \ b] = YP^T[CI+PP^T]^{-1}$, wherein $P = [k(A, B^T)e]^T \in \mathfrak{R}^{(\overline{m}+1) \times m}$ is the training sample set; I is a unit matrix, and $Y \in \mathfrak{R}^{N \times m}$ is a matrix comprising m category label vectors of the training samples;

(3.b) by utilizing the quantum particle swarm optimization algorithm to optimize the mathematic model of VVRKFA, obtaining an optimum regularization parameter and an optimum kernel parameter of the mathematic model of VVRKFA;

(3.c) taking the training samples $x_i$ in the training sample set as input data, constructing a vector value mapping function (2) for the optimum regularization parameter and the optimum kernel parameter obtained in step (3.b);

$$p(x_i) = \Theta K(x_i^T, B^T)^T + b \quad (2)$$

wherein, $\Theta \in \mathfrak{R}^{N \times \overline{m}}$ is the regression coefficient matrix; $B \in \mathfrak{R}^{\overline{m} \times n}$ is the dimensionality-reduced sample data set obtained after the dimensionality of the training sample set is reduced; $K(.,.)$ is the kernel function, and in formula (2), the kernel function refers to the optimum kernel function obtained in step (3.b); C is the regularization parameter, and in formula (2), the regularization parameter C is the optimum kernel parameter obtained in step (3.b); $b \in \mathfrak{R}^{N \times 1}$ is the base vector, N is the number of fault classes; m is the dimensionality of training samples in the training sample set; $\overline{m}$ is the dimensionality of the samples in the dimensionality-reduced sample data set obtained after the dimensionality of the training sample set is reduced; n is the amount of all the training samples in the training sample set;

(3.d) by utilizing the mapping function constructed in step (3.c), establishing a decision function of VVRKFA, wherein the decision function of VVRKFA is expressed as:

$$\text{Class}(x) = \operatorname{argmin}_{1 \leq j \leq N} d_M(\hat{p}(x_t), \overline{p}^{(j)} | \Sigma) \quad (3)$$

wherein, $x_t$ is test samples in the test sample set; $\overline{p}^{(j)} = (1/n_j) \sum_{i=1}^{n_j} \hat{p}(x_i)$ is the center point of all training samples corresponding to the $j^{th}$ fault class in the training sample set, $d_M$ is the Mahalanobis distance, $x_i$ is the training samples in the training sample set, $\hat{\Sigma}=\Sigma_{j=1}^{N}(n_j-1)\hat{\Sigma}^{(j)}/(n-N)$ is an intra-class covariance matrix, and n is the amount of all the training samples in the training sample set; N is the number of fault classes; $n_j$ is the amount of training samples corresponding to the $j^{th}$ fault class in the training sample set; $\hat{p}(x_i)$ is a mapping projection of the training samples $x_i$ in a characteristic sub-space; $\hat{p}(x_t)$ is a mapping projection of the test samples $x_t$ in the characteristic sub-space.

wherein when the decision function is established, constructing the VVRKFA-based fault diagnosis model is accomplished.

2. A method for diagnosing an analog circuit fault based on vector-valued regularized kernel function approximation, comprising steps of:

step (1): collecting output signals comprising: extracting time domain response voltage signals of all nodes of an analog circuit under test;

step (2): carrying out wavelet packet decomposition on the output signals collected, calculating energy of all nodes as original sample characteristic data, and equally dividing the original sample characteristic data into a training sample set and a test sample set;

step (3): utilizing a quantum particle swarm optimization (QPSO) algorithm to optimize a regularization parameter and kernel parameter of vector-valued regularized kernel function approximation (VVRKFA) on the basis of the training sample set, and constructing a VVRKFA-based fault diagnosis model;

step (4): inputting the test sample set to the constructed VVRKFA-based fault diagnosis model to recognize circuit fault classes;

wherein in step (3), the process of constructing the VVRKFA-based fault diagnosis model comprises steps of:

(3.a) determining a type of a kernel function:

adopting a Gaussian kernel function $K(x_i,x_j)=\exp(\sigma\|x_i-x_j\|^2)$ is as the kernel function of VVRKFA to establish a mathematic model of VVRKFA, wherein $\sigma$ is a width factor of the Gaussian kernel function;

wherein a mathematic model of VVRKFA is:

$$\text{Min } J(\Theta, b, \xi) = \frac{C}{2}tr([\Theta\ b]^T[\Theta\ b]) + \frac{1}{2}\sum_{i=1}^{m}\|\xi_i\|^2; \quad (1)$$

$$\text{s.t. } \Theta K(x_i^T, B^T)^T + b + \xi_i = Y_i, i = 1, 2, \ldots, m$$

wherein, $\Theta \in \Re^{N \times \overline{m}}$ is a regression coefficient matrix for mapping a characteristic inner product space to a label space; N is an amount of fault classes; m is a dimensionality of training samples in the training sample set; $\overline{m}$ is a dimensionality of samples in a dimensionality-reduced sample data set obtained after the dimensionality of the training sample set is reduced; $b \in \Re^{N \times 1}$ is a base vector; C is the regularization parameter; $\xi_i \in \Re^{N \times 1}$ is a slack variable; matrix $B \in \Re^{\overline{m} \times n}$ is the dimensionality-reduced sample data set ($\overline{m} \leq m$) obtained after the dimensionality of the training sample set is reduced; n is an amount of all the training samples in the training sample set; $K(.,.)$ is the kernel function; $x_i$ is the training samples in the training sample set; $Y_i$ is a category label vector of the training sample $x_i$; T is a matrix transpose symbol; J is a target function name;

$[\Theta\ b] = YP^T[CI+PP^T]^{-1}$, wherein $P=[k(A,B^T)\ e]^T \in \Re^{(\overline{m}+1) \times m}$ is the training sample set; I is a unit matrix, and $Y \in \Re^{N \times m}$ is a matrix comprising m category label vectors of the training samples;

(3.b) by utilizing the quantum particle swarm optimization algorithm to optimize the mathematic model of VVRKFA, obtaining an optimum regularization parameter and an optimum kernel parameter of the mathematic model of VVRKFA;

(3.c) taking the training samples $x_i$ in the training sample set as input data, constructing a vector value mapping function (2) for the optimum regularization parameter and the optimum kernel parameter obtained in step (3.b);

$$p(x_i)=\Theta K(x_i^T,B^T)^T+b \quad (2)$$

wherein, $\Theta \in \Re^{N \times \overline{m}}$ is the regression coefficient matrix; $B \in \Re^{\overline{m} \times n}$ is the dimensionality-reduced sample data set obtained after the dimensionality of the training sample set is reduced; $K(.,.)$ is the kernel function, and in formula (2), the kernel function refers to the optimum kernel function obtained in step (3.b); C is the regularization parameter, and in formula (2), the regularization parameter C is the optimum kernel parameter obtained in step (3.b); $b \in \Re^{N \times 1}$ is the base vector, N is the number of fault classes; m is the dimensionality of training samples in the training sample set; $\overline{m}$ is the dimensionality of the samples in the dimensionality-reduced sample data set obtained after the dimensionality of the training sample set is reduced; n is the amount of all the training samples in the training sample set;

(3.d) by utilizing the mapping function constructed in step (3.c), establishing a decision function of VVRKFA, wherein the decision function of VVRKFA is expressed as:

$$\text{Class}(x)=\arg\min_{1=j=N}d_M(\hat{p}(x_i),\overline{p}^{(j)}|\hat{\Sigma}) \quad (3)$$

wherein, $x_t$ is test samples in the test sample set; $\overline{p}^{(j)}=(1/n_j)\Sigma_{i=1}^{n_j}\hat{p}(x_i)$ is the center point of all training samples corresponding to the $j^{th}$ fault class in the training sample set, du is the Mahalanobis distance, $x_i$ is the training samples in the training sample set, $\hat{\Sigma}=\Sigma_{j=1}^{N}(n_j-1)\hat{\Sigma}^{(j)}/(n-N)$ is an intra-class covariance matrix, and n is the amount of all the training samples in the training sample set; N is the number of fault classes; $n_j$ is the amount of training samples corresponding to the $j^{th}$ fault class in the training sample set; $\hat{p}(x_i)$ is a mapping projection of the training samples $x_i$ in a characteristic sub-space; $\hat{p}(x_t)$ is a mapping projection of the test samples $x_t$ in the characteristic sub-space.

wherein when the decision function is established, constructing the VVRKFA-based fault diagnosis model is accomplished;

wherein in step (3.b): utilizing the quantum particle swarm optimization algorithm to optimize the regularization parameter and kernel parameter of the mathematic model of VVRKFA to obtain an optimum regularization parameter and an optimum kernel parameter of the mathematic model of VVRKFA specifically comprises steps of:

(3.b.1) initializing parameters of the QPSO algorithm, comprising velocity, location, population size, iterations and optimization range, wherein each particle is a two-dimensional vector, a first dimension is the regularization parameter of the mathematic model of VVRKFA, and a second dimension is the kernel parameter of the mathematic model of VVRKFA;
(3.b.2) calculating a fitness of the particles to obtain a global optimum individual and a local optimum individual;
(3.b.3) updating a velocity and location of the particles; and
(3.b.4) repeating step (3.b.2) and Step (3.b.3) until a maximum iteration is reached, and outputting an optimum parameter result, which is denoted as the optimum regularization parameter and the optimum kernel parameter of the mathematic model of VVRKFA.

3. A method for diagnosing an analog circuit fault based on vector-valued regularized kernel function approximation, comprising steps of:

step (1): collecting output signals comprising: extracting time domain response voltage signals of all nodes of an analog circuit under test;

step (2): carrying out wavelet packet decomposition on the output signals collected, calculating energy of all nodes as original sample characteristic data, and equally dividing the original sample characteristic data into a training sample set and a test sample set;

step (3): utilizing a quantum particle swarm optimization (QPSO) algorithm to optimize a regularization parameter and kernel parameter of vector-valued regularized kernel function approximation (VVRKFA) on the basis of the training sample set, and constructing a VVRKFA-based fault diagnosis model;

step (4): inputting the test sample set to the constructed VVRKFA-based fault diagnosis model to recognize circuit fault classes;

wherein in step (3), the process of constructing the VVRKFA-based fault diagnosis model comprises steps of:

(3.a) determining a type of a kernel function:
adopting a Gaussian kernel function $K(x_i,x_j)=\exp(\sigma\|x_i-x_j\|^2)$ is as the kernel function of VVRKFA to establish a mathematic model of VVRKFA, wherein $\sigma$ is a width factor of the Gaussian kernel function;

wherein a mathematic model of VVRKFA is:

$$\text{Min}J(\Theta, b, \xi) = \frac{C}{2}tr\{[\Theta\ b]^T[\Theta\ b]\}+\frac{1}{2}\sum_{i=1}^{m}\|\xi_i\|^2 \quad (1)$$

$$\text{s.t.}\ \Theta K(x_i^T, B^T)^T + b + \xi_i = Y_i, i = 1, 2, \ldots, m$$

wherein, $\Theta \in \Re^{N \times \overline{m}}$ is a regression coefficient matrix for mapping a characteristic inner product space to a label space; N is an amount of fault classes; m is a dimensionality of training samples in the training sample set; $\overline{m}$ is a dimensionality of samples in a dimensionality-reduced sample data set obtained after the dimensionality of the training sample set is reduced; $b \in \Re^{N \times 1}$ is a base vector; C is the regularization parameter; $\xi_i \in \Re^{N \times 1}$ is a slack variable; matrix $B \in \Re^{\overline{m} \times n}$ is the dimensionality-reduced sample data set ($\overline{m} \leq m$) obtained after the dimensionality of the training sample set is reduced; n is an amount of all the training samples in the training sample set; K(.,.) is the kernel function; $x_i$ is the training samples in the training sample set; $Y_i$ is a category label vector of the training sample $x_i$; T is a matrix transpose symbol; J is a target function name; $[\Theta\ b]=YP^T[CI+PP^T]^{-1}$, wherein $P=[k(A,B^T)\ e]^T \in \Re^{(\overline{m}+1) \times m}$ is the training sample set; I is a unit matrix, and $Y \in \Re^{N \times m}$ is a matrix comprising m category label vectors of the training samples;

(3.b) by utilizing the quantum particle swarm optimization algorithm to optimize the mathematic model of VVRKFA, obtaining an optimum regularization parameter and an optimum kernel parameter of the mathematic model of VVRKFA;

(3.c) taking the training samples $x_i$ in the training sample set as input data, constructing a vector value mapping function (2) for the optimum regularization parameter and the optimum kernel parameter obtained in step (3.b);

$$p(x_i)=\Theta K(x_i^T,B^T)^T+b \quad (2)$$

wherein, $\Theta \in \Re^{N \times \overline{m}}$ is the regression coefficient matrix; $B \in \Re^{\overline{m} \times n}$ is the dimensionality-reduced sample data set obtained after the dimensionality of the training sample set is reduced; K(.,.) is the kernel function, and in formula (2), the kernel function refers to the optimum kernel function obtained in step (3.b); C is the regularization parameter, and in formula (2), the regularization parameter C is the optimum kernel parameter obtained in step (3.b); $b \in \Re^{N \times 1}$ is the base vector, N is the number of fault classes; m is the dimensionality of training samples in the training sample set; $\overline{m}$ is the dimensionality of the samples in the dimensionality-reduced sample data set obtained after the dimensionality of the training sample set is reduced; n is the amount of all the training samples in the training sample set;

(3.d) by utilizing the mapping function constructed in step (3.c), establishing a decision function of VVRKFA, wherein the decision function of VVRKFA is expressed as:

$$\text{Class}(x)=\text{argmin}_{1 \leq j \leq N} d_M(\hat{p}(x_t),\overline{p}^{(j)}|\hat{\Sigma}) \quad (3)$$

wherein, $x_t$ is test samples in the test sample set; $\overline{p}^{(j)}=(1/n_j)\Sigma_{i=1}^{n_j}\hat{p}(x_i)$ is the center point of all training samples corresponding to the $j^{th}$ fault class in the training sample set, $d_M$ is the Mahalanobis distance, $x_i$ is the training samples in the training sample set, $\hat{\Sigma}=\Sigma_{j=1}^{N}(n_j-1)\hat{\Sigma}^{(j)}/(n-N)$ is an intra-class covariance matrix, and n is the amount of all the training samples in the training sample set; N is the number of fault classes; $n_j$ is the amount of training samples corresponding to the $j^{th}$ fault class in the training sample set; $\hat{p}(x_i)$ is a mapping projection of the training samples $x_i$ in a characteristic sub-space; $\hat{p}(x_t)$ is a mapping projection of the test samples $x_t$ in the characteristic sub-space.

wherein when the decision function is established, constructing the VVRKFA-based fault diagnosis model is accomplished;

wherein in step (4), inputting the test sample data set to the fault diagnosis model to recognize the circuit fault classes to obtain the fault class of each test sample in the test sample set, thereby the diagnosis accuracy of each fault class is obtained, and diagnosis of the analog circuit under test is completed.

* * * * *